US012628664B2

(12) United States Patent
Kubo et al.

(10) Patent No.: US 12,628,664 B2
(45) Date of Patent: May 12, 2026

(54) METAL COMPONENT

(71) Applicant: Mitsui High-tec, Inc., Fukuoka (JP)

(72) Inventors: Kimihiko Kubo, Fukuoka (JP); Ryota Furuno, Fukuoka (JP); Tomokatsu Kunitake, Fukuoka (JP)

(73) Assignee: Mitsui High-tec, Inc., Fukuoka (JP)

( * ) Notice: Subject to any disclaimer, the term of this patent is extended or adjusted under 35 U.S.C. 154(b) by 143 days.

(21) Appl. No.: 18/406,609

(22) Filed: Jan. 8, 2024

(65) Prior Publication Data

US 2024/0243045 A1     Jul. 18, 2024

(30) Foreign Application Priority Data

Jan. 18, 2023    (JP) ................................. 2023-005696

(51) Int. Cl.
| | |
|---|---|
| *C25D 5/00* | (2006.01) |
| *C25D 3/46* | (2006.01) |
| *C25D 7/12* | (2006.01) |
| *H10W 70/40* | (2026.01) |
| *H10W 72/50* | (2026.01) |
| *H10W 90/00* | (2026.01) |

(52) U.S. Cl.
CPC ............ *H10W 70/457* (2026.01); *C25D 3/46* (2013.01); *C25D 5/605* (2020.08); *C25D 5/617* (2020.08); *C25D 7/12* (2013.01); *H10W*

*70/411* (2026.01); *H10W 70/429* (2026.01); *H10W 72/5522* (2026.01); *H10W 72/5525* (2026.01); *H10W 90/756* (2026.01)

(58) Field of Classification Search
None
See application file for complete search history.

(56) References Cited

U.S. PATENT DOCUMENTS

| | | | |
|---|---|---|---|
| 2017/0110389 A1* | 4/2017 | Hayashi | .................. H01L 24/97 |
| 2020/0303289 A1* | 9/2020 | Hishiki | .............. H01L 23/3142 |
| 2024/0145356 A1* | 5/2024 | Nagata | .................... H01L 23/50 |

FOREIGN PATENT DOCUMENTS

| | | |
|---|---|---|
| EP | 4124678 A1 | 2/2023 |
| JP | 5-3277 A | 1/1993 |
| JP | 2022-148743 A | 10/2022 |

* cited by examiner

*Primary Examiner* — Elizabeth Collister
(74) *Attorney, Agent, or Firm* — RANKIN, HILL & CLARK LLP

(57) ABSTRACT

Provided is a metal component that is used for manufacturing a semiconductor device, the metal component including a substrate having a conductivity; and a noble metal plating layer formed on all or part of a surface of the substrate, wherein the noble metal plating layer has a lumpy protrusion on a surface of the noble metal plating layer.

3 Claims, 7 Drawing Sheets

| EXAMPLE | BEFORE HEAT TREATMENT | AFTER HEAT TREATMENT |
|---|---|---|
| SURFACE MORPHOLOGY | | |
| CROSS-SECTIONAL MORPHOLOGY | | |

METAL COMPONENT

CROSS-REFERENCE TO RELATED APPLICATION

This application is based on Japanese Patent Application No. 2023-005696 filed with the Japan Patent Office on Jan. 18, 2023, the entire content of which is hereby incorporated by reference.

BACKGROUND

1. Technical Field

The present disclosure relates to a metal component.

2. Related Art

Conventionally, a technique for forming a noble metal plating layer on the metal component such as a lead frame used for manufacturing a semiconductor device has been known. This plating layer is formed on a part or all of a surface of a metal substrate of the metal component. Among them, the metal component having an Ag plating layer formed on a part of the metal substrate mainly made of Cu is widely employed in the semiconductor device that requires reliability because of high heat dissipation and conductivity (see JP-A-05-003277).

A semiconductor device includes a semiconductor element, a metal component, and the like sealed with a resin. Therefore, there is an interface between the metal and the resin. The metal and the resin have very different coefficients of thermal expansion. Therefore, stress increases at the interface between the metal and the resin due to heat generated during mounting or driving. Then, adhesive strength between such a sealing resin and the plating layer may be reduced. Thus, there is a possibility that peeling may occur between the sealing resin and the plating layer. In such a case, reliability of the semiconductor device is reduced.

One aspect of the present embodiment has been made in view of the above problems. That is, an object of the present disclosure is to provide a metal component capable of improving the reliability of the semiconductor device in a high temperature environment.

SUMMARY

A metal component according to an embodiment of the present disclosure is used for manufacturing a semiconductor device, the metal component including a substrate having a conductivity; and a noble metal plating layer formed on all or part of a surface of the substrate, wherein the noble metal plating layer has a lumpy protrusion on a surface of the noble metal plating layer.

DETAILED DESCRIPTION

Figures 1A, 1B:
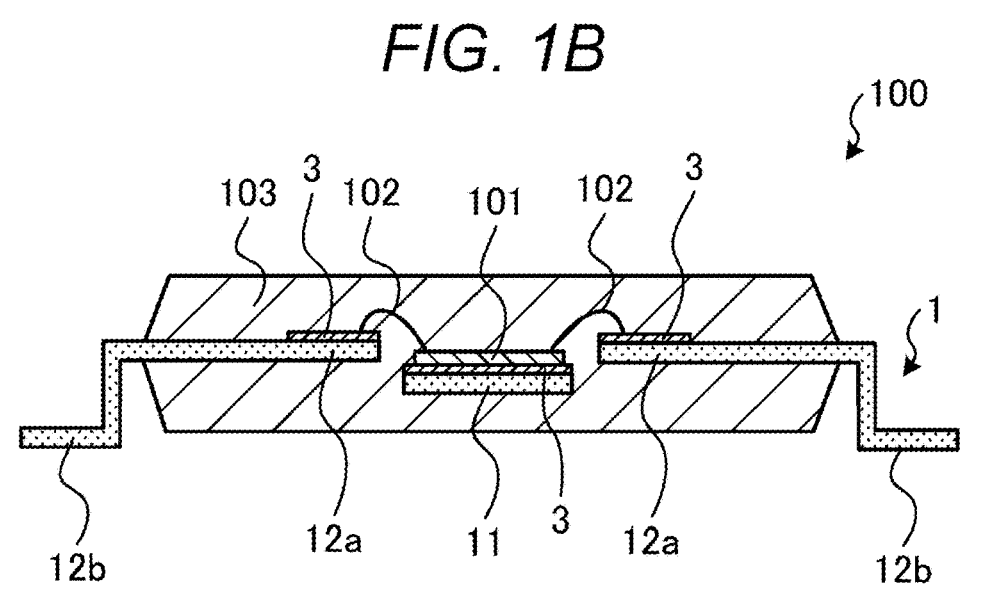
FIG. 1A is a schematic diagram of a lead frame used in the present embodiment.
FIG. 1B is a cross-sectional view illustrating a semiconductor device used in the present embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A metal component according to an embodiment of the present disclosure is configured to be used for manufacturing a semiconductor device. This metal component includes a substrate having a conductivity, and a noble metal plating layer formed on all or part of a surface of the substrate. The noble metal plating layer has a lumpy protrusion on a surface of the noble metal plating layer.

According to one aspect of the present embodiment, the reliability of the semiconductor device in the high temperature environment is improved.

Hereinafter, a lead frame will be described as an example of the metal component according to the present embodiment used for manufacturing the semiconductor device with reference to the attached drawings. Note that the present embodiment is not limited to an embodiment described below.

In addition, the drawings are schematic drawings. It should be noted that relationships, ratios, and the like between dimensions of elements may differ from actual dimensions of the elements. Further, also among the drawings, the relationships or ratios between the dimensions of the same portions may be different from each other.

Conventionally, in the metal component such as the lead frame used for manufacturing the semiconductor device, a technique for forming the noble metal plating layer such as an Ag plating layer on a part or all of a surface of a metal substrate is known. The Ag plating layer formed on the surface of the metal substrate improves bonding strength between the metal substrate and the semiconductor element and the bonding strength between the metal substrate and a bonding wire. Therefore, the reliability of the semiconductor device is improved.

Among them, the lead frame having the Ag plating layer formed on a part of the surface of the metal substrate mainly made of Cu has high heat dissipation and conductivity. Therefore, such a lead frame is widely employed in the semiconductor device that requires reliability.

The semiconductor device includes the semiconductor element, the metal component, and the like sealed with a resin. Therefore, there is an interface between the metal and the resin. The metal and the resin have very different coefficients of thermal expansion. Therefore, stress increases at the interface between the metal and the resin due to heat generated during mounting or driving.

In particular, solder reflow temperature during mounting is higher than a glass transition temperature of the resin. Such a reflow temperature extremely reduces the adhesive strength between the sealing resin and the metal component. Thus, the noble metal plating layer having a low adhesive strength with the resin cannot withstand the stress, and there is a possibility that the peeling may occur between the noble metal plating layer and the sealing resin. In such a case, the reliability of the semiconductor device is reduced.

Therefore, in order to overcome the above-mentioned problems, it is expected to realize a technique capable of improving the reliability of the semiconductor device in the high temperature environment.

Lead Frame and Semiconductor Device

First, a lead frame 1 and a semiconductor device 100 used in the present embodiment will be described with reference to FIGS. 1A and 1B. FIG. 1A is a schematic diagram of the lead frame 1 used in the present embodiment. FIG. 1B is a cross-sectional view of the semiconductor device 100 used in the present embodiment.

The lead frame 1 illustrated in FIG. 1A is a lead frame used for manufacturing a quad flat package (QFP) type semiconductor device 100. Note that the present embodiment may be applied to the lead frame used for manufacturing other types, for example, a small outline package (SOP) semiconductor device, or a quad flat non-leaded package (QFN) semiconductor device having a lead exposed on a back surface thereof.

The lead frame 1 used in the present embodiment has, for example, a strip shape in a plan view. In the lead frame 1, a plurality of unit lead frames 10 are formed side by side in a longitudinal direction of the lead frame 1. Such a unit lead frame 10 is a portion corresponding to each of semiconductor devices 100 manufactured by using the lead frame 1. It should be noted that the unit lead frames 10 may be formed side by side not only in the longitudinal direction of the lead frame 1 but also in a width direction of the lead frame 1.

As illustrated in FIG. 1A, the unit lead frame 10 includes a die pad 11, a plurality of leads 12, and a dam bar 13. Note that although not illustrated in FIG. 1A, pilot holes may be provided side by side on a side surface on a long side of the lead frame 1.

The die pad 11 is provided, for example, in a central portion of the unit lead frame 10. As illustrated in FIG. 1B, a semiconductor element 101 can be mounted on a front surface side of the die pad 11.

The die pad 11 is connected to an outer edge portion of the unit lead frame 10 by a die pad support portion 11a. In this way, the die pad 11 is supported by the unit lead frame 10. The die pad support portion 11a is provided, for example, at each of four corners of the die pad 11.

The leads 12 are arranged side by side around the die pad 11. Each of tip portions 12a extends from the outer edge portion of the unit lead frame 10 toward the die pad 11. As illustrated in FIG. 1B, the lead 12 functions as a connection terminal of the semiconductor device 100.

The lead 12 includes a tip portion 12a and a base end portion 12b. As illustrated in FIG. 1B, in the semiconductor device 100, a bonding wire 102 made of Cu, a Cu alloy, Au, an Au alloy, or the like is connected to the tip portion 12a of the lead 12. Therefore, the lead frame 1 is required to have high bonding characteristics with the bonding wire 102. The dam bar 13 connects adjacent leads 12 to each other.

The semiconductor device 100 includes a sealing resin 103 in addition to the lead frame 1, the semiconductor element 101, and the bonding wire 102. The sealing resin 103 is made of, for example, an epoxy resin or the like. The sealing resin 103 is molded into a predetermined shape by a molding process or the like. The sealing resin 103 seals the semiconductor element 101, the bonding wire 102, a surface of the die pad 11, the tip portion 12a of the lead 12, and the like.

Further, the base end portion 12b of the lead 12 functions as an external terminal (outer lead) of the semiconductor device 100. The semiconductor device 100 is solder-bonded to a substrate at the base end portion 12b. Further, the semiconductor device 100 of the type having a back surface of the die pad 11 exposed from the sealing resin 103 or the type having a heat slug provided on the back surface is solder-bonded to the substrate on the back surface thereof. Therefore, the lead frame 1 is required to have high wettability to solder.

Note that the dam bar 13 has a dam function for suppressing leakage of the resin used to the base end portion 12b (outer lead) side in the molding process of molding the sealing resin 103. The dam bar 13 is finally cut in a manufacturing process of the semiconductor device 100.

Here, in the lead frame 1 used in the present embodiment, a plating layer 3 is formed on the die pad 11 and the tip portion 12a of the lead 12. The plating layer 3 is an example of the noble metal plating layer. The plating layer 3 is made of, for example, Ag (silver) as a main component.

Thus, the bonding strength between the lead frame 1 and the bonding wire 102 is improved. Further, the bonding strength between the lead frame 1 and the solder is improved. Therefore, the bonding strength between the lead frame 1 and the semiconductor element 101 is improved. Note that the plating layer 3 is formed at a functionally required position, and the position is not limited.

Details of Lead Frame

Figure 2A:
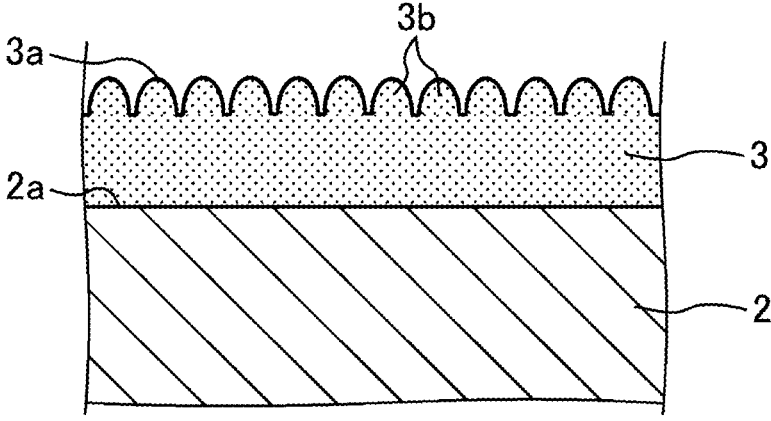
FIG. 2A is an enlarged cross-sectional view of the lead frame used in the present embodiment.

Subsequently, details of the lead frame 1 used in the present embodiment will be described with reference to FIG. 2A. FIG. 2A is an enlarged cross-sectional view of the lead frame 1 used in the present embodiment.

As illustrated in FIG. 2A, the lead frame 1 according to the present embodiment includes the substrate 2 and the plating layer 3. The substrate 2 is made of a conductive material (for example, a metal material such as copper, a copper alloy, or an iron-nickel alloy).

The plating layer 3 is formed on a surface 2a of the substrate 2. In the present embodiment, the plating layer 3 contains Ag as the main component. Further, as illustrated in FIG. 2A, the plating layer 3 has a surface 3a with irregularities. That is, the surface 3a of the plating layer 3 has a plurality of protrusions 3b.

Note that at least one plating layer containing Cu, Ni, Pd, Au, Ag, or the like as the main component may be formed as a base plating layer between the substrate 2 and the plating layer 3 for the purpose of preventing metal diffusion or improving heat resistance. Further, the plating layer containing Au, Pt, Pd, Ag or the like as the main component may be formed on the surface of the plating layer 3.

Here, in the present embodiment, as illustrated in FIG. 2A, it is preferable that the protrusion 3b formed on the surface 3a of the plating layer 3 has a lump shape rather than a needle shape or a tree shape.

Note that in the present disclosure, "lump shape" refers to a shape that does not have large dimensional anisotropy. In other words, "lump shape" refers to a shape in which a difference between a width of the protrusion 3b and a height of the protrusion 3b is relatively small. For example, a ratio of the height of the protrusion 3b to the width of the protrusion 3b is about 0.3 to 3.

Further, in the present embodiment, the protrusion 3b has a lump shape. Therefore, the protrusion 3b has a rounded shape at a tip thereof. For example, in the present embodiment, an arithmetic mean curvature of peak (Spc) of the surface 3a may be less than 10,000 mm$^{-1}$.

When an acicular or a dendritic protrusion 3b having large dimensional anisotropy is formed on the surface 3a of the plating layer 3, the shape of the protrusion 3b tends to undergo crystal recovery at high temperatures. Therefore, when the semiconductor device 100 is exposed to the high temperature environment, morphology of the surface 3a may change significantly.

That is, when the shape of the protrusion 3b is, for example, acicular or dendritic with large dimensional anisotropy, the adhesive strength between the sealing resin 103 and the plating layer 3 is greatly reduced in the high temperature environment. Therefore, the reliability of the semiconductor device 100 in the high temperature environment may be reduced.

On the other hand, in the present embodiment, the protrusion 3b has a lump shape. Therefore, the dimensional anisotropy of the protrusion 3b is small. Further, its Spc is also relatively small. As a result, even when the semiconductor device 100 is exposed to the high temperature environment, a change in morphology of the surface 3a is suppressed.

Thus, when the semiconductor device 100 is exposed to the high temperature environment (for example, when the semiconductor device 100 is mounted on a printed circuit board or the like in a reflow process), reduction in the adhesive strength between the sealing resin 103 and the plating layer 3 is minimized.

Therefore, according to the present embodiment, the reliability of the semiconductor device 100 in the high temperature environment is improved.

Further, in the present embodiment, the surface 3a of the plating layer 3 is preferably covered with the plurality of protrusions 3b. Thus, the entire surface 3a can obtain an anchor effect for the sealing resin 103. Therefore, the adhesive strength between the sealing resin 103 and the plating layer 3 is further improved.

Further, in the present embodiment, a ratio of crystal orientation <111> to crystal orientation <001> is preferably 2 or more in the plating layer 3.

This minimizes reduction in the adhesive strength between the sealing resin 103 and the plating layer 3 that occurs when the semiconductor device 100 is exposed to the high temperature environment (for example, when the semiconductor device 100 is mounted on a printed circuit board or the like in a reflow process).

Therefore, according to the present embodiment, the reliability of the semiconductor device 100 in the high temperature environment is improved.

Further, in the present embodiment, when the plating layer 3 formed on the substrate 2 is sealed with the sealing resin 103, then, heated to 260° C., a shear strength between the plating layer 3 and the sealing resin 103 is preferably 2 MPa or more.

In this way, the adhesive strength (that is, the shear strength) between the sealing resin 103 and the plating layer 3 when the semiconductor device 100 is exposed to the high temperature environment is set to a predetermined value or more. This further improves the reliability of the semiconductor device 100 in the high temperature environment.

Further, in the present embodiment, when the plating layer 3 formed on the substrate 2 is sealed with the sealing resin 103, then, heated to 260° C., the shear strength between the plating layer 3 and the sealing resin 103 is preferably 10% or more of the shear strength between the plating layer 3 and the sealing resin 103 before heating.

In this way, a residual ratio of the adhesive strength (that is, shear strength) between the sealing resin 103 and the plating layer 3 when the semiconductor device 100 is exposed to the high temperature environment is set to a predetermined ratio or more. This further improves the reliability of the semiconductor device 100 in the high temperature environment.

Further, in the present embodiment, pull strength is preferably 5.0 g or more in a stitch pull strength test using the plating layer 3. The stitch pull strength test is a test in which the bonding strength between the plating layer 3 and the bonding wire 102 is measured as the pull strength. According to the present embodiment, the bonding strength measured by the stitch pull strength test is set to a predetermined value or more. This further improves the reliability of the semiconductor device 100.

EXAMPLE

Hereinafter, the present embodiment will be described in more detail with reference to Example and Comparative Examples. However, the present embodiment is not limited to the following example.

Evaluation 1

Example

First, a lead frame substrate containing copper as a main component was prepared. Next, the substrate was degreased and washed with acids. Thereafter, by an electroplating treatment, an Ag plating layer was formed on a surface of the substrate.

A plating bath used for the electroplating treatment was made up by adding K(AgCN$_2$): 115 g/L and a roughening additive: 80 ml/L to a bath mainly containing a conductive salt such as a nitrate or an organic acid salt. Then, the Ag plating layer having a thickness of 5 μm was formed under electroplating treatment conditions of bath temperature: 61° C. and current density: 70 A/dm$^2$. At this time, a formation time of the Ag plating layer was 7 sec.

By the electroplating treatment under such conditions, the Ag plating layer having a surface with irregularities was formed. Further, the protrusion of the irregularities was found to have a lump shape. Thus, a lead frame of Example was obtained.

7
8

Comparative Example 1

First, a lead frame substrate containing copper as the main component was prepared. Next, the substrate was degreased and washed with acids. Thus, the lead frame of Comparative Example 1 was obtained. That is, in Comparative Example 1, the Ag plating layer was not formed on a surface of the lead frame. In the lead frame, a copper substrate was directly exposed.

Comparative Example 2

First, a lead frame substrate containing copper as a main component was prepared. Next, the substrate was degreased and washed with acids. Thereafter, by an electroplating treatment, an Ag plating layer was formed on a surface of the substrate.

A plating bath used for the electroplating treatment was made up by adding $K(AgCN_2)$: 120 g/L to a bath mainly containing a conductive salt such as a nitrate or an organic acid salt. Then, the Ag plating layer having a thickness of 5 μm was formed under electroplating treatment conditions of bath temperature: 65° C. and current density: 70 A/dm².

By the electroplating treatment under such conditions, the Ag plating layer having a smooth surface was formed. That is, in Comparative Example 2, the Ag plating layer was found to have no protrusion. Thus, the lead frame of Comparative Example 2 was obtained.

Figure 2B:
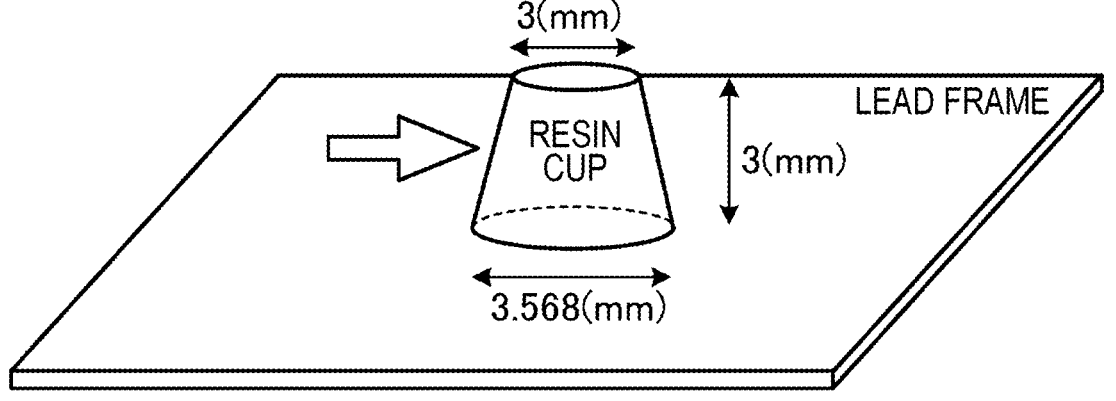
FIG. 2B is a diagram for explaining a test sample used in a shear strength test.

Subsequently, the shear strength of the lead frames of Example and Comparative Examples 1 and 2 obtained above was evaluated. FIG. 2B illustrates a test sample used in a shear strength test. First, as illustrated in FIG. 2B, a resin cup made of an epoxy resin (EME-G631H) was formed on surfaces of the lead frames of Example and Comparative Examples 1 and 2.

The resin cup was molded under conditions of molding temperature: 180° ° C., molding time: 90 seconds, cure temperature: 180° C., and cure time: 4 hours.

Next, a cup shear test was performed according to a procedure defined by SEMI standard G69-0996. Specifically, a gauge (not illustrated) was pressed against the resin cup of each test sample and moved in a direction of an arrow in FIG. 2B. In this way, the shear strength was measured. During this measurement, a height (a shear height) of the gauge was 100 μm. A speed (shear speed) of the gauge was 100 μm/s.

Figure 3A:
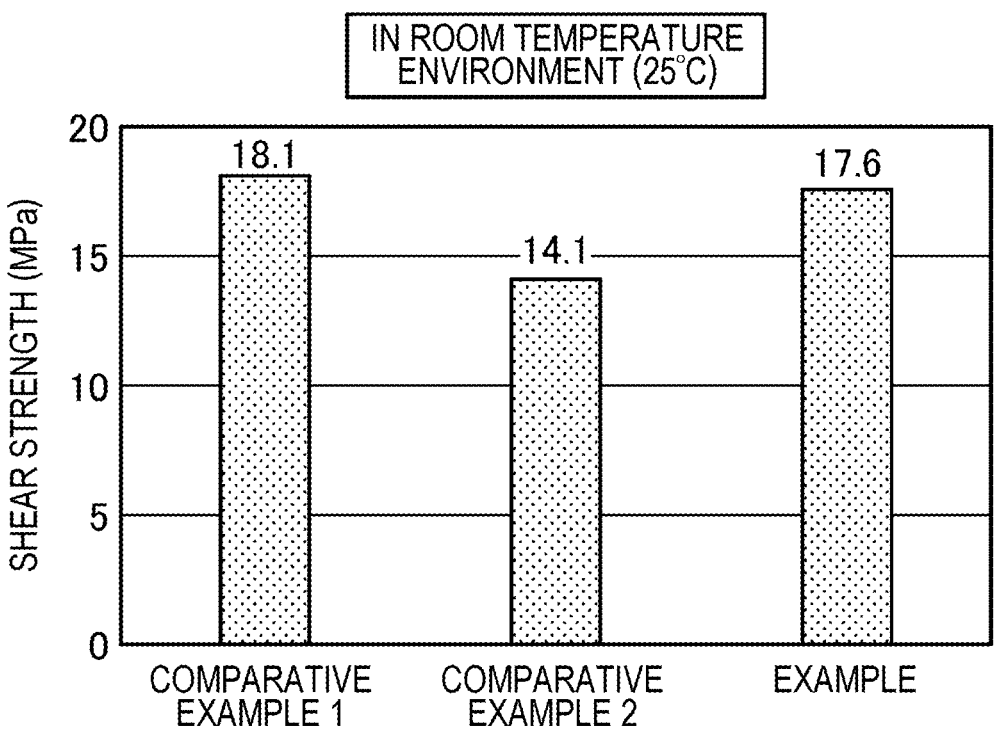
FIG. 3A is a diagram illustrating shear strengths of lead frames of Comparative Examples 1 and 2, and Example in a room temperature environment.

FIG. 3A illustrates the shear strength of the lead frames of Comparative Example 1, Comparative Example 2, and Example in the room temperature environment. FIG. 3A illustrates Comparative Example 2 in which a smooth Ag plating layer is formed and Example in which an Ag plating layer having lumpy protrusions is formed. By comparing Comparative Example 2 and Example, it can be seen that the shear strength of the lead frame of Example was increased in the room temperature environment.

Therefore, according to the present embodiment, the reliability of the semiconductor device in the room temperature environment is improved.

Note that copper exhibits better adhesion to the sealing resin than silver. From this, as illustrated in FIG. 3A, the shear strength of the lead frame of Comparative Example 1 shows a good value in the room temperature environment.

Figure 3B:
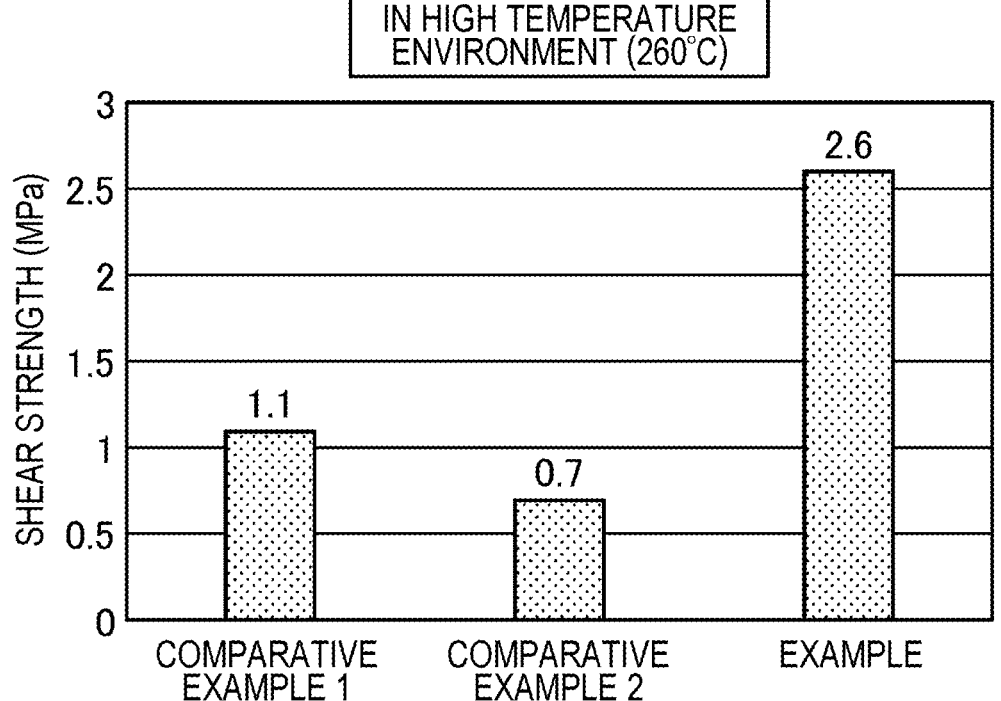
FIG. 3B is a diagram illustrating the shear strengths of the lead frames of Comparative Examples 1 and 2, and Example in a high temperature environment.

FIG. 3B illustrates the shear strength of the lead frames of Comparative Example 1, Comparative Example 2, and Example in the high temperature environment. Measurement results illustrated in the figure are results of the shear strength test performed in an environment of 260° C.

As illustrated in FIG. 3B, the shear strength of the lead frames of Comparative Example 1 and Comparative Example 2 was significantly reduced in the high-temperature environment. In contrast, reduction in the shear strength of the lead frame of Example was minimized.

Specifically, the shear strength of the lead frame of Comparative Example 1 in the high temperature environment was reduced to about 6% of the shear strength in the room temperature environment. Further, the shear strength of the lead frame of Comparative Example 2 in the high temperature environment was reduced to about 5% of the shear strength in the room temperature environment. On the other hand, the shear strength of the lead frame of Example in the high temperature environment was only reduced to about 15% of the shear strength in the room temperature environment.

In this way, as shown by a comparison between Comparative Examples 1 and 2 and Example, the lead frame of Example minimized the reduction in the adhesive strength between the sealing resin and the plating layer in the high temperature environment. Therefore, according to the present embodiment, the reliability of the semiconductor device in the high temperature environment is improved.

Evaluation 2

Next, the plating layers of the lead frames of Comparative Example 2 and Example obtained above were observed using a scanning electron microscope (SEM). A field of view of the resulting plating layer was analyzed using an electron backscatter diffraction device (EBSD).

Through this analysis, a ratio of crystal orientation <001> in the plating layer was determined. Similarly, a ratio of crystal orientation <111> was determined. From the determined ratios, a ratio R was determined using the following equation (1). Results are shown in Table 1.

$$R = \text{ratio of crystal orientation} <111>/\text{ratio of crystal orientation} <001> \quad (1)$$

TABLE 1

|  | Example | Comparative Example 2 |
|---|---|---|
| Ratio R | 4.2 | 1.7 |

As shown in Table 1, the lead frame of Example was found to have the ratio R of 2 or more. On the other hand, the lead frame of Comparative Example 2 was found to have the ratio R of less than 2.

As described above, according to a comparison between Comparative Example 2 and Example, the lead frame of Example minimized the reduction in the adhesive strength between the sealing resin and the plating layer in the high temperature environment by having the Ratio R of 2 or more. Therefore, according to the present embodiment, the reliability of the semiconductor device in the high temperature environment can be improved.

Evaluation 3

Comparative Example 3

First, a lead frame substrate containing copper as a main component was prepared. Next, the substrate was degreased and washed with acids. Thereafter, by an electroplating treatment, an Ag plating layer was formed on a surface of the substrate.

In order to prepare a plating bath used in the electroplating treatment, 6.6 g/L of silver methanesulfonate was dissolved in water. Then, in the electroplating treatment, the bath temperature was set at 60° C. Further, the current density was set to 1 A/dm$^2$. Under this treatment conditions, the Ag plating layer having a thickness of 0.25 µm was formed.

By the electroplating treatment under such conditions, the Ag plating layer having a roughened surface was formed. Further, in the Ag plating layer of Comparative Example 3, the shape of the protrusion was not lumpy. Thus, the lead frame of Comparative Example 3 was obtained.

Subsequently, the surface morphology and cross-sectional morphology near the surface of the lead frames of Comparative Example 3 and Example obtained above were evaluated. A commercially available scanning electron microscope (SEM) (Hitachi Ultra-High Resolution Field Emission Scanning Electron Microscope S-4800 manufactured by Hitachi High-Tech Fielding Corporation) was used for the evaluation.

Note that the evaluation of the surface morphology and the cross-sectional morphology near the surface was performed before heat treatment and after a predetermined heat treatment (400° C., 10 minutes).

Although not illustrated, it was found that recrystallization progressed in the plating layer of the lead frame of Comparative Example 3 after heat treatment. Therefore, the morphology of the surface of the plating layer changed significantly.

That is, in the semiconductor device using the lead frame of Comparative Example 3, there is a possibility that the peeling may occur between the plating layer and the sealing resin in the high temperature environment due to such a large change in the surface morphology. Therefore, there is a possibility that the reliability may be reduced in the high temperature environment.

Figure 4:
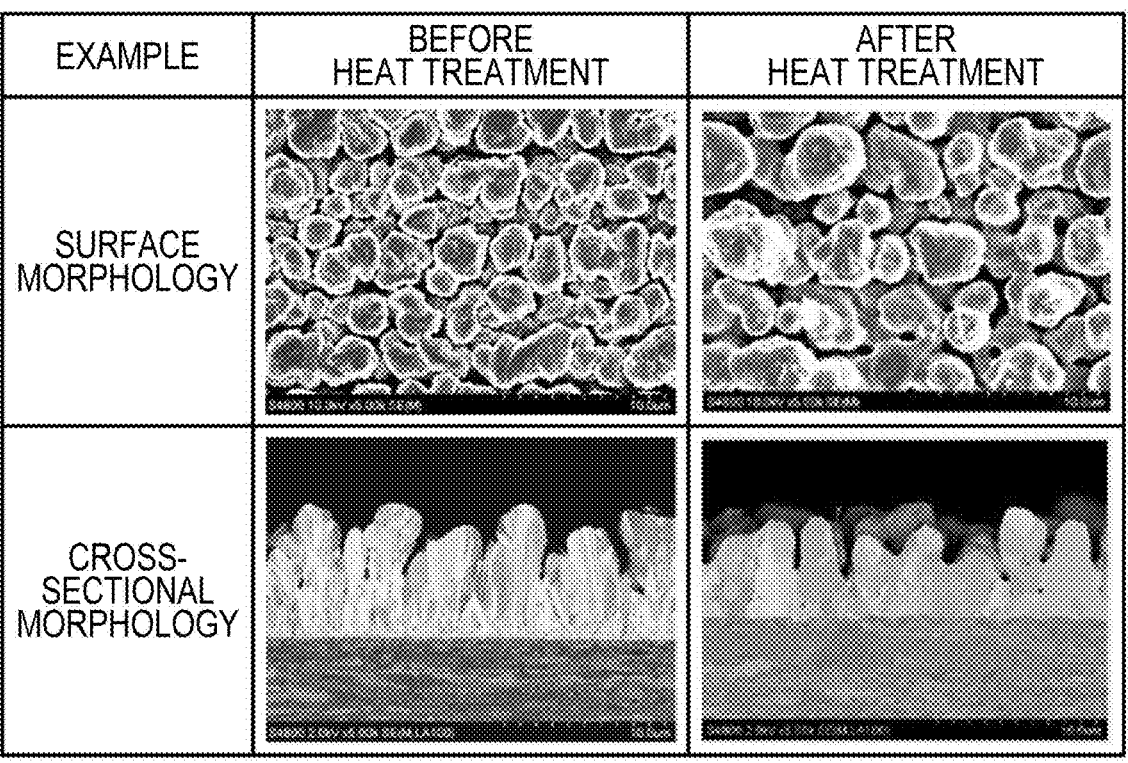
FIG. 4 is a diagram illustrating a surface morphology and a cross-sectional morphology of a plating layer formed on the lead frame of Example before heat treatment, and the surface morphology and the cross-sectional morphology after heat treatment.

FIG. 4 illustrates the surface morphology and the cross-sectional morphology of the plating layer formed on the lead frame of Example before and after the heat treatment. As illustrated in FIG. 4, in the lead frame of Example, it is found that the surface morphology hardly changes even after the heat treatment.

Further, in the lead frame of Example illustrated in FIG. 4, the shape of the protrusion before the heat treatment was lumpy. Further, the shape of the protrusion after the heat treatment was also lumpy. That is, in the lead frame of Example, it is found that the shape of the protrusion hardly changed even after the heat treatment.

As described above, the surface morphology of the lead frame of Example does not change significantly even after thermal history is applied to the lead frame. Furthermore, the protrusion is maintained in a lump shape. Therefore, it is possible to minimize the reduction in the adhesive strength between the sealing resin and the plating layer.

Evaluation 4

Next, the arithmetic mean curvature of peak (Spc) of the surfaces of the lead frames of Example and Comparative Example 3 was evaluated using a commercially available surface roughness measuring device (shape analysis laser microscope VK-X260 manufactured by Keyence Corporation). In the evaluation, a 150x objective lens was used.

The arithmetic mean curvature of peak (Spc) of the surface is one of parameters of surface roughness. A smaller value of the Spc indicates that a curvature of the peak of the protrusion is smaller, that is, the protrusion is lumpy.

Note that in this evaluation, a total of seven points on the surface of the lead frame of Example were measured. Similarly, a total of three points on the surface of the lead frame of Comparative Example 3 were measured. Then, for Example and Comparative Example 3, a minimum value, a maximum value, and an average value of the Spc were determined. Results are shown in Table 2.

TABLE 2

| Spc | Example | Comparative Example 3 |
|---|---|---|
| Minimum value | 4490 | 39145 |
| Maximum value | 6027 | 40571 |
| Average value | 5050 | 39751 |

(Unit: mm$^{-1}$)

As shown in Table 2, in the lead frame of Example, the Spc was less than 10000 mm$^{-1}$ at all measurement points. On the other hand, in the lead frame of Comparative Example 3, the Spc was 10000 mm-1 or more at all measurement points.

In this way, as shown by a comparison between Comparative Example 3 and Example, the lead frame of Example minimized the reduction in the adhesive strength between the sealing resin and the plating layer in the high temperature environment by having a surface Spc of less than 10000 mm$^{-1}$. Therefore, according to the present embodiment, the reliability of the semiconductor device in the high temperature environment is improved.

Evaluation 5

Next, a variation of the shear strength when a measurement temperature changed (that is, the variation of the shear strength when the thermal history applied to the lead frame changed) was evaluated. Specifically, as illustrated in FIG. 2B, the lead frame of Example having a resin cup formed on the surface was held at a predetermined temperature between 160° C. and 400° ° C. for 10 minutes. Thereafter, the shear strength of each lead frame held at the predetermined temperature was measured. Results are illustrated in FIG. 5.

Figure 5:
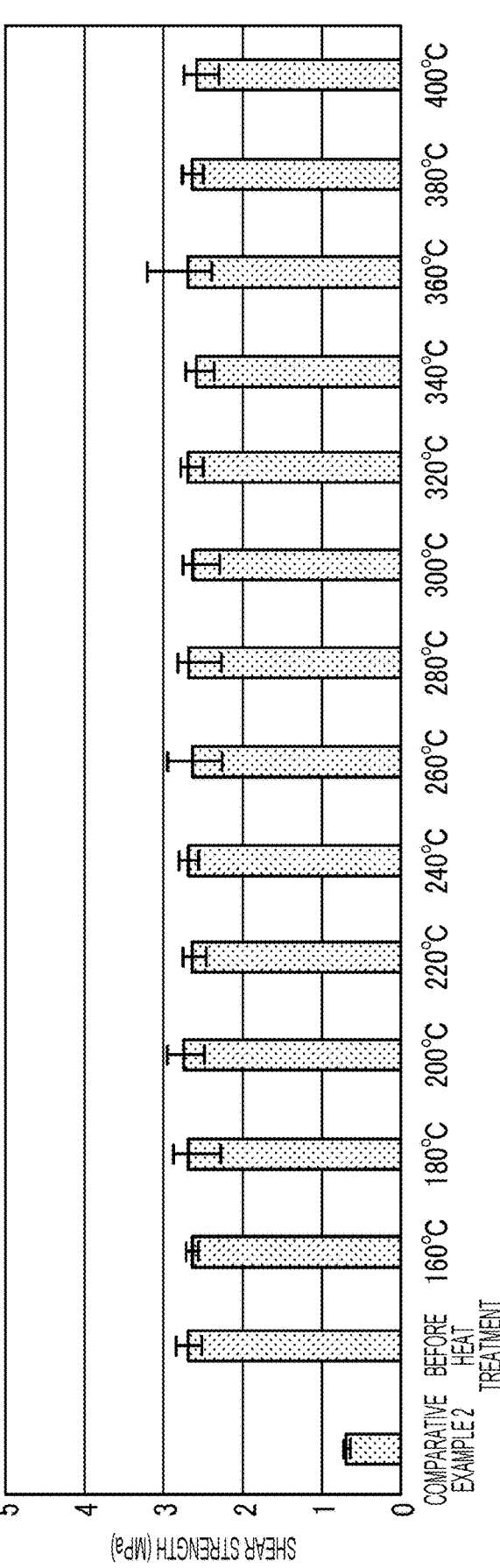
FIG. 5 is a diagram illustrating a variation in the shear strength due to a thermal history of the lead frame of Example.

FIG. 5 illustrates the variation in the shear strength due to the thermal history of the lead frame of Example. As illustrated in FIG. 5, it can be seen that the lead frame of Example maintained the shear strength in a thermal environment even when subjected to the thermal history in a range of 160° C. to 400° C.

Therefore, according to the present embodiment, even when the thermal history is applied to the lead frame in the range of 160° C. to 400° C., the reduction in the adhesive strength between the sealing resin and the plating layer is minimized.

Evaluation 6

Subsequently, the shear strength of the lead frames of Example and Comparative Example 3 when subjected to the thermal history was evaluated. Specifically, as illustrated in FIG. 2B, the lead frame of Example having a resin cup formed on the surface was held at 300° C. for 10 minutes or at 400° ° C. for 10 minutes. Thereafter, the shear strength of each of the lead frames held was measured in a room temperature environment (25° C.) or a high temperature environment (260° C.). Results are illustrated in FIGS. 6A to 7B.

Figure 6A:
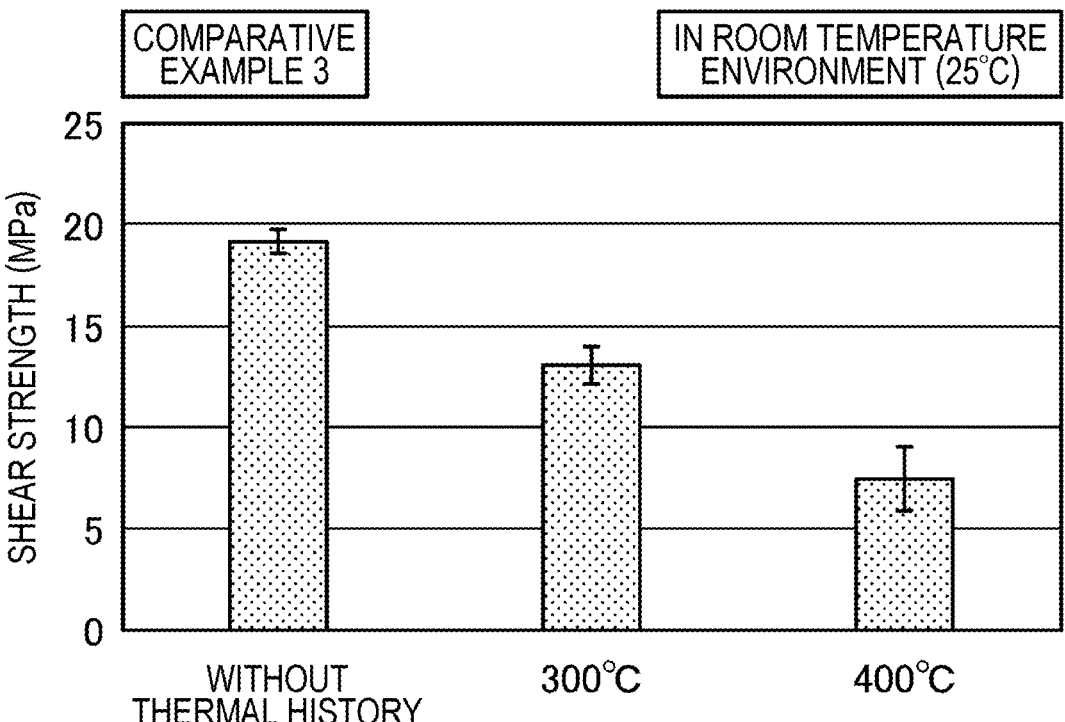
FIG. 6A is a diagram illustrating a variation in the shear strength in the room temperature environment due to the thermal history of the lead frame of Comparative Example 3.
Figure 6B:
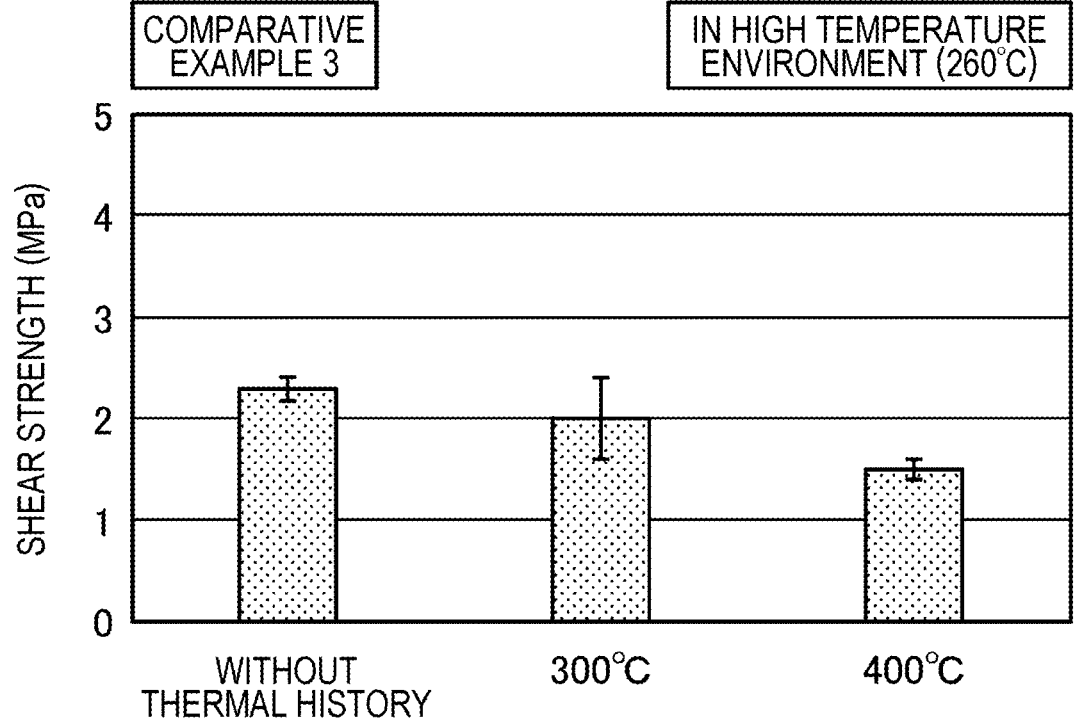
FIG. 6B is a diagram illustrating a variation in the shear strength in the high temperature environment due to the thermal history of the lead frame of Comparative Example 3.

FIG. 6A illustrates a variation in the shear strength of the lead frame of Comparative Example 3 in the room temperature environment due to the thermal history. FIG. 6B illustrates a variation in the shear strength of the lead frame of Comparative Example 3 in the high temperature environment due to the thermal history. As illustrated in FIGS. 6A and 6B, it can be seen that in Comparative Example 3 in which a silver methanesulfonate plating layer was formed, the shear strength was reduced due to the thermal history.

Figure 7A:
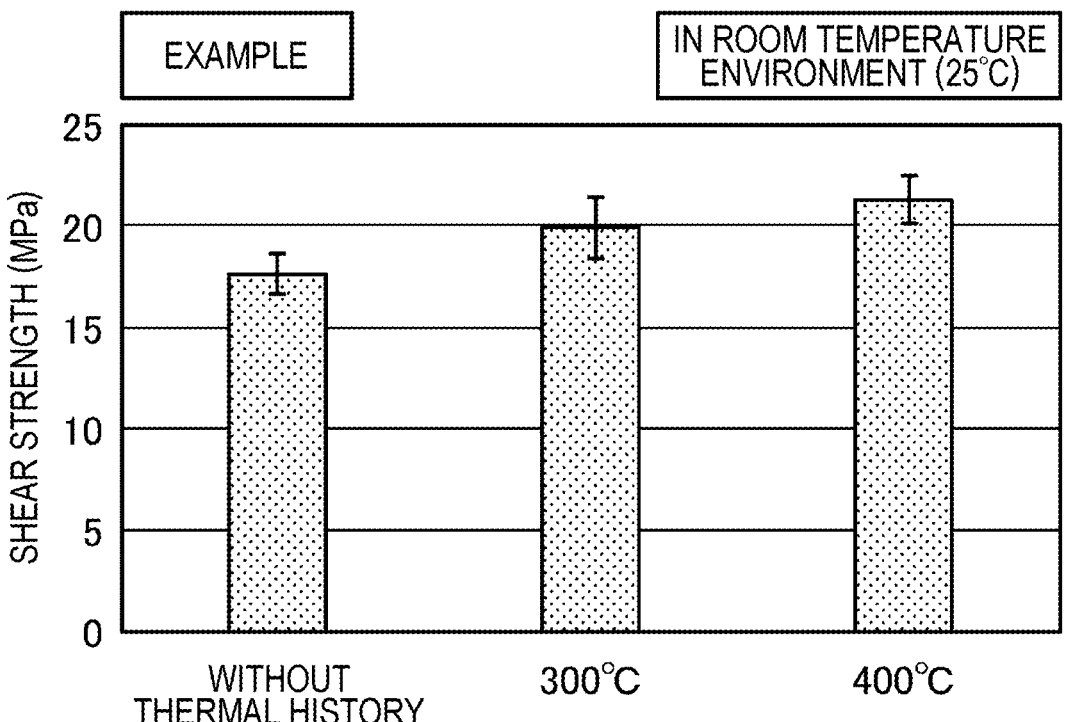
FIG. 7A is a diagram illustrating a variation in the shear strength in the room temperature environment due to the thermal history of the lead frame of Example.
Figure 7B:
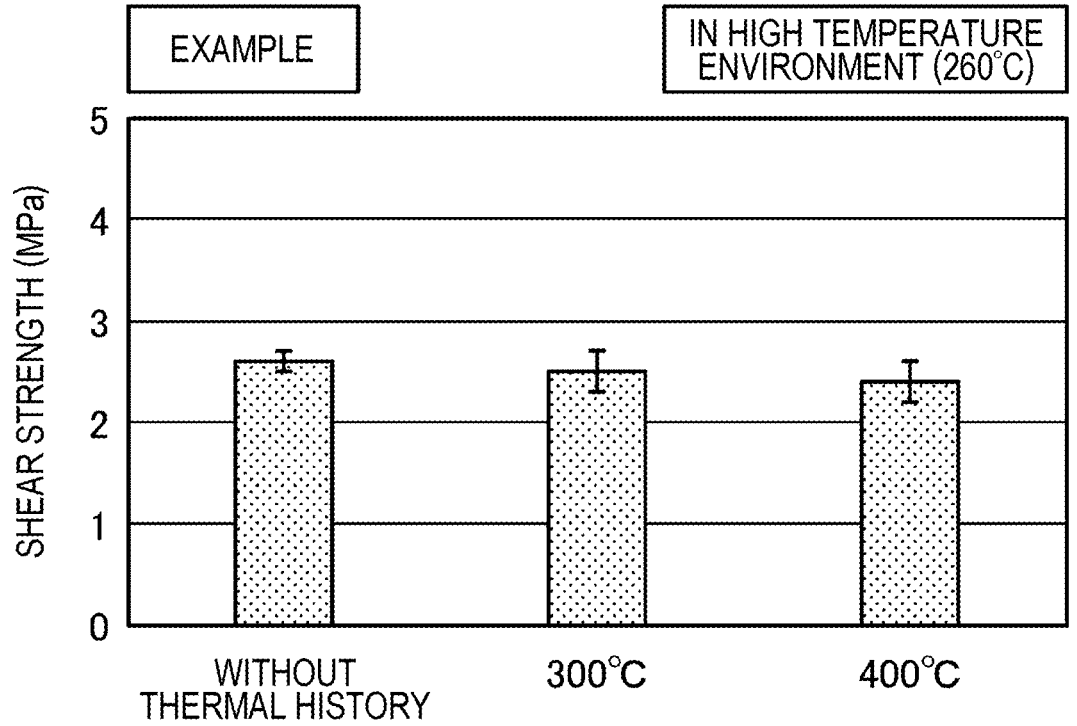
FIG. 7B is a diagram illustrating a variation in the shear strength in the high temperature environment due to the thermal history of the lead frame of Example.

FIG. 7A illustrates a variation in the shear strength of the lead frame of Example in the room temperature environment due to the thermal history. FIG. 7B illustrates a variation in the shear strength of the lead frame of Example in the high temperature environment due to the thermal history. As illustrated in FIGS. 7A and 7B, it can be seen that the shear strength was maintained in Example in spite of the thermal history.

In this way, as shown by a comparison between Comparative Example 3 and Example, the lead frame of Example minimized the reduction in the adhesive strength between the sealing resin and the plating layer in the high temperature environment. Therefore, according to the present embodiment, the reliability of the semiconductor device in the high temperature environment is improved.

Evaluation 7

Next, semiconductor devices were assembled using the lead frames of Example and Comparative Example 2. Then, an assembly evaluation was performed during this assembly. In addition, reliability evaluation of the assembled semiconductor device was performed. Results are shown in Table 3.

layer in a stitch shape. Next, a hook was hooked on this stitch-shaped bonding wire. In this way, a tensile test was performed at a rate of 170 μm/s. A tensile strength obtained in the tensile test was evaluated as a result of the stitch pull strength test.

Further, as shown in Table 3, good results were not obtained in reliability evaluation of the semiconductor device using the lead frame of Comparative Example 2. On the other hand, good results were obtained in the reliability evaluation of the semiconductor device using the lead frame of Example.

That is, a lumpy protrusion is formed on the surface of the plating layer used in the present embodiment. This can impart high reliability to the semiconductor device.

The present embodiment has been described above. However, the present embodiment is not limited to the above-described embodiment. Various modifications can be made to the above-described embodiment without departing from the gist of the present embodiment. For example, in the above embodiment, the plating layer containing Ag as the main component is exemplified. However, the present embodiment is not limited to such an example. The protrusion formed on the surface of the plating layer containing a noble metal element other than Ag as the main component may have a lumpy shape.

As described above, the metal component (lead frame 1) according to the present embodiment is used for manufacturing the semiconductor device. The metal component includes the substrate 2 and the noble metal plating layer (plating layer 3). The substrate 2 has a conductivity. The noble metal plating layer (plating layer 3) is formed on all or part of the surface of the substrate 2. Further, the noble metal plating layer (plating layer 3) has a lumpy protrusion 3b on the surface 3a. This improves the reliability of the semiconductor device 100 in the high temperature environment.

TABLE 3

|  | Evaluation Item | Standard | Comparative Example 2 |  | Example 1 |  |
| --- | --- | --- | --- | --- | --- | --- |
| Assembly evaluation | Paste wettability | Wettability > 90% | 100% | PASS | 100% | PASS |
|  | EBO amount | EBO amount < 200 μm | <2.0 μm | PASS | <110 μm | PASS |
|  | Recognition matching rate | Matching rate > 80% | 90% | PASS | >90% | PASS |
|  | Die shear strength | Shear strength > 2.5 kg | Min. 39.7 kg | PASS | Min. 37.8 kg | PASS |
|  | Top pull strength | Pull strength > 4.0 g | Min. 9.0 g | PASS | Min. 8.9 g | PASS |
|  | Stitch pull strength | Pull strength > 2.5 g | Min. 4.4 g | PASS | Min. 5.5 g | PASS |
|  | MOLD quality | No voids, no unfilled | All clear | PASS | All clear | PASS |
|  | TRIM burr height | Burr height < 0.050 mm | <0.013 mm | PASS | <0.013 mm | PASS |
|  | FORM appearance | No clevis | All clear | PASS | All clear | PASS |
|  | Initial SAT | No peeling | 0/60 pcs | PASS | 0/60 pcs | PASS |
| Reliability evaluation | Solder heat resistance test (MSL-2) | No peeling | 30/30 pcs | FAIL | 0/30 pcs | PASS |
|  | Solder heat resistance test (MSL-1) | No peeling | 30/30 pcs | FAIL | 0/30 pcs | PASS |

As shown in Table 3, good results were obtained in all items in both the assembly evaluation in the case of using the lead frame of Comparative Example 2 and the assembly evaluation in the case of using the lead frame of Example.

Furthermore, in the stitch pull strength test, the surface with irregularities tends to exhibit a low pull strength value. Nevertheless, the lead frame of Example having a surface with irregularities showed better results (Min. 5.5 g) than the lead frame of Comparative Example 2 having a smooth surface. Thus, according to the present embodiment, it is possible to assemble the semiconductor device more stably.

Note that in the stitch pull strength test in the present disclosure, the pull strength was evaluated as follows. First, the bonding wire was bonded to the surface of the plating Further, in the metal component (the lead frame 1) according to the present embodiment, the surface 3a of the noble metal plating layer (the plating layer 3) is covered with a plurality of lumpy protrusions 3b. This further improves the adhesive strength between the sealing resin 103 and the plating layer 3.

Further, in the metal component (the lead frame 1) according to the present embodiment, the arithmetic mean curvature of peak (Spc) of the surface 3a of the noble metal plating layer (the plating layer 3) is less than 10,000 mm$^{-1}$. This improves the reliability of the semiconductor device 100 in the high temperature environment.

Further, in the metal component (the lead frame 1) according to the present embodiment, the noble metal plating layer (the plating layer 3) contains Ag as a main component. This improves the bonding strength between the lead frame 1 and the bonding wire 102. At the same time, the bonding strength between the lead frame 1 and the semiconductor element 101 is improved.

Further, in the metal component (the lead frame 1) according to the present embodiment, the ratio R of the crystal orientation <111> to the crystal orientation <001> is 2 or more in the noble metal plating layer (the plating layer 3). This improves the reliability of the semiconductor device 100 in the high temperature environment.

Other aspects of the present embodiment are not excluded by a particularly detailed or representative embodiment described above. Those skilled in the art can easily derive further effects and modifications of the present embodiment from the present disclosure. Accordingly, various modifications can be made to the above embodiment without departing from the spirit or scope of the comprehensive concept of the present embodiment as defined by the appended claims and their equivalents.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A metal component that is used for manufacturing a semiconductor device, the metal component comprising:

a substrate having a conductivity; and a noble metal plating layer formed on all or part of a surface of the substrate, wherein the noble metal plating layer has a lumpy protrusion on a surface of the noble metal plating layer, the noble metal plating layer contains Ag as a main component, and a ratio of crystal orientation <111> to crystal orientation <001> is 2 or more in the noble metal plating layer.

2. The metal component according to claim 1, wherein the surface of the noble metal plating layer is covered with a plurality of the lumpy protrusions.

3. The metal component according to claim 2, wherein the surface of the noble metal plating layer has an arithmetic mean curvature of peak (Spc) of less than 10,000 mm$^{-1}$.

* * * * *